(12) United States Patent
Lee et al.

(10) Patent No.: US 7,405,949 B2
(45) Date of Patent: Jul. 29, 2008

(54) MEMORY SYSTEM HAVING POINT-TO-POINT (PTP) AND POINT-TO-TWO-POINT (PTTP) LINKS BETWEEN DEVICES

(75) Inventors: Jae-Jun Lee, Seongnam-si (KR); Joo-Sun Choi, Yongin-si (KR); Kyu-Hyoun Kim, Suwon-si (KR); Kwang-Soo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/603,648

(22) Filed: Nov. 22, 2006

(65) Prior Publication Data
US 2007/0133247 A1 Jun. 14, 2007

(30) Foreign Application Priority Data
Dec. 9, 2005 (KR) .................. 10-2005-0120882
Jan. 17, 2006 (KR) .................. 10-2006-0005103

(51) Int. Cl.
*H05K 7/14* (2006.01)
(52) U.S. Cl. .................. 361/802; 361/684; 361/733; 361/736; 361/737; 361/761
(58) Field of Classification Search .................. 361/802, 361/684, 733, 736, 737, 761, 796; 711/105, 711/103, 115, 165, 170, 172, 202, 209; 365/51, 365/63, 506
See application file for complete search history.

(56) References Cited

U.S. PATENT DOCUMENTS 5,357,621 A * 10/1994 Cox .................. 711/172
5,519,843 A * 5/1996 Moran et al. .................. 711/103
5,611,064 A * 3/1997 Maund et al. .................. 711/209
5,860,142 A * 1/1999 Cepulis .................. 711/202
6,295,591 B1 * 9/2001 Bealkowski et al. .................. 711/165
6,342,983 B1 * 1/2002 Nonoyama et al. .................. 360/48
6,366,983 B1 * 4/2002 Bains .................. 711/115
6,487,102 B1 11/2002 Halbert et al.
6,493,250 B2 * 12/2002 Halbert et al. .................. 365/63
6,601,163 B1 * 7/2003 Cromer et al. .................. 713/1
6,877,079 B2 4/2005 Yoo et al.
7,206,897 B2 * 4/2007 Perego et al. .................. 711/105

(Continued)

FOREIGN PATENT DOCUMENTS

JP 2002-7308 1/2002
JP 2003-122624 4/2003
KR 100450672 9/2004

*Primary Examiner*—Tuan Dinh
*Assistant Examiner*—Xiaoliang Chen
(74) *Attorney, Agent, or Firm*—Mills & Onello LLP

(57) ABSTRACT

A memory system has first and second primary memories and first and second secondary memories coupled to the first and second primary memories, respectively, the coupling comprising at least one point-to-point connection. A memory module includes at least two of the first and second primary and first and second secondary memories. A first connection element, such as a connector or solder, connects the memory module to a mother board. A second connection element, such as a connector or solder, connects at least one other of the first and second primary and first and second secondary memories to the mother board. At least one of the memories on the first memory module is coupled to at least one of the other memories. The memory system also includes a memory controller which is connected to the primary memories by a point-to-two-point link.

21 Claims, 16 Drawing Sheets

U.S. PATENT DOCUMENTS

| | | | |
|---|---|---|---|
| 2001/0018717 A1* | 8/2001 | Shimotono | 709/319 |
| 2002/0023191 A1 | 2/2002 | Fudeyasu | |
| 2002/0095578 A1* | 7/2002 | Yamada et al. | 713/176 |
| 2002/0129215 A1 | 9/2002 | Yoo et al. | |
| 2003/0130832 A1* | 7/2003 | Schulter et al. | 703/23 |
| 2004/0125635 A1* | 7/2004 | Kuzmenka | 365/51 |
| 2004/0225856 A1* | 11/2004 | Braun et al. | 711/170 |
| 2005/0044305 A1* | 2/2005 | Jakobs et al. | 711/105 |
| 2007/0061614 A1* | 3/2007 | Choi | 714/6 |
| 2007/0064515 A1* | 3/2007 | Choi | 365/230.05 |

\* cited by examiner

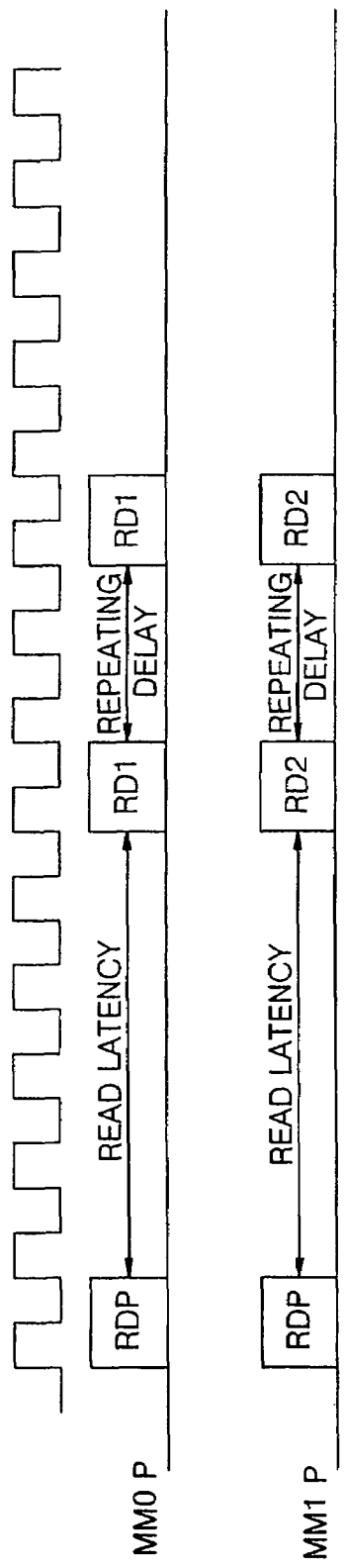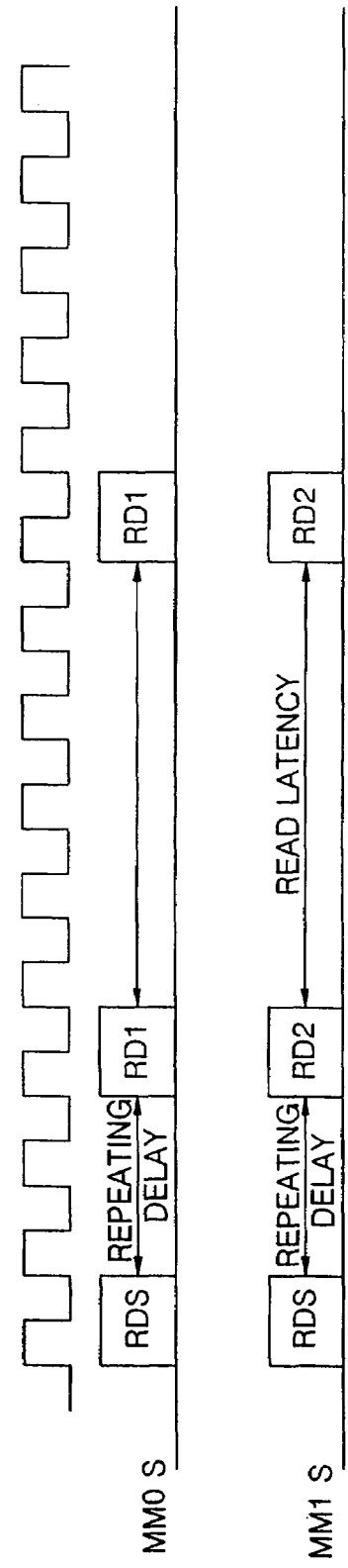

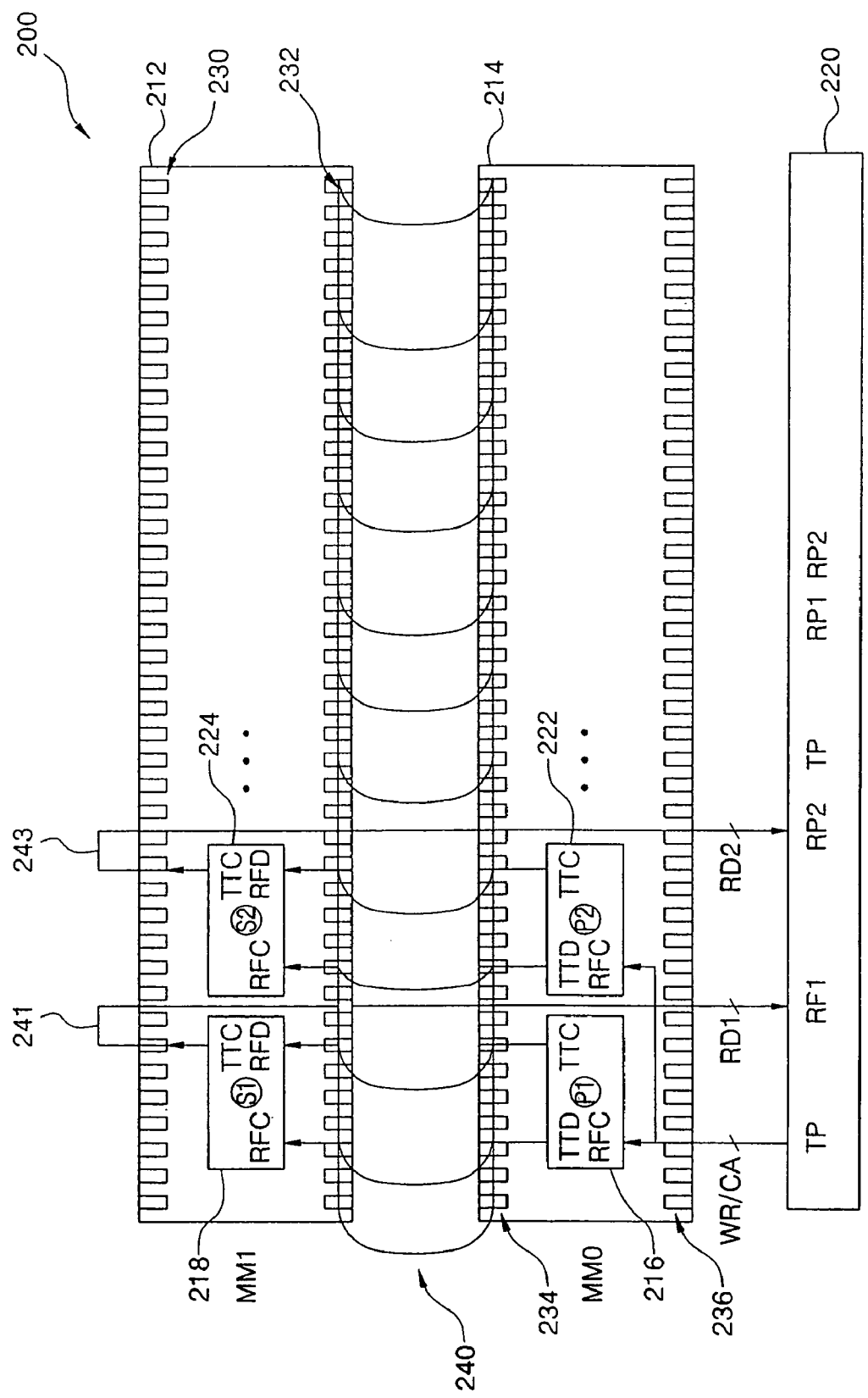

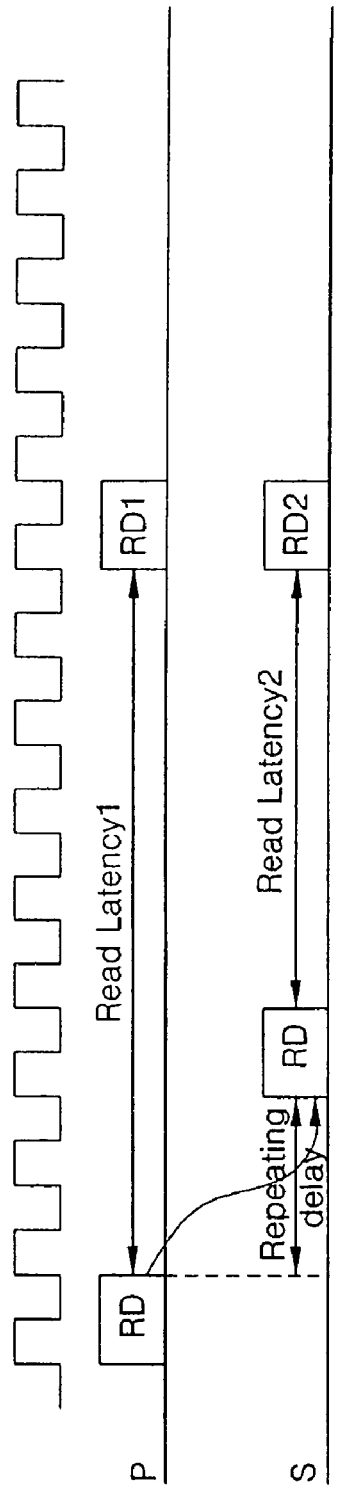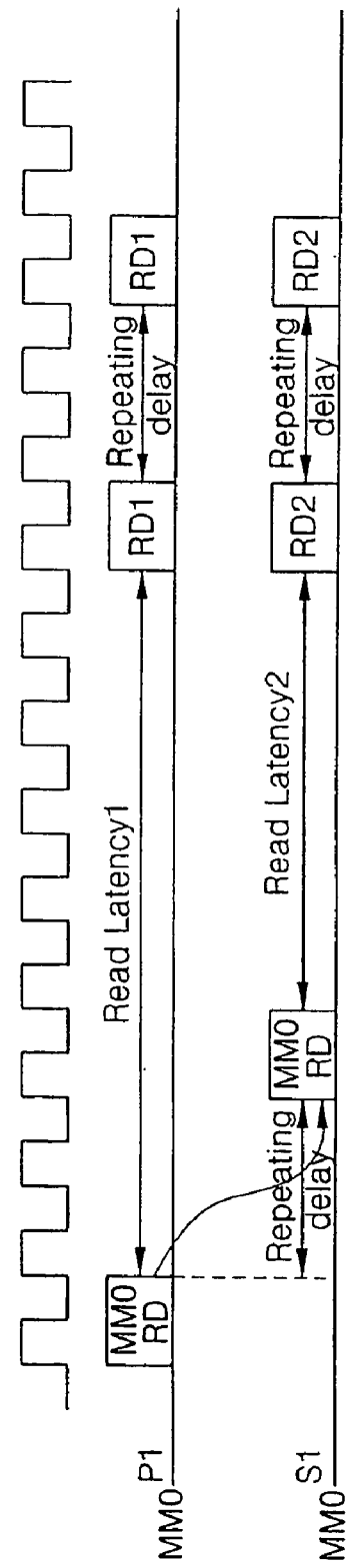

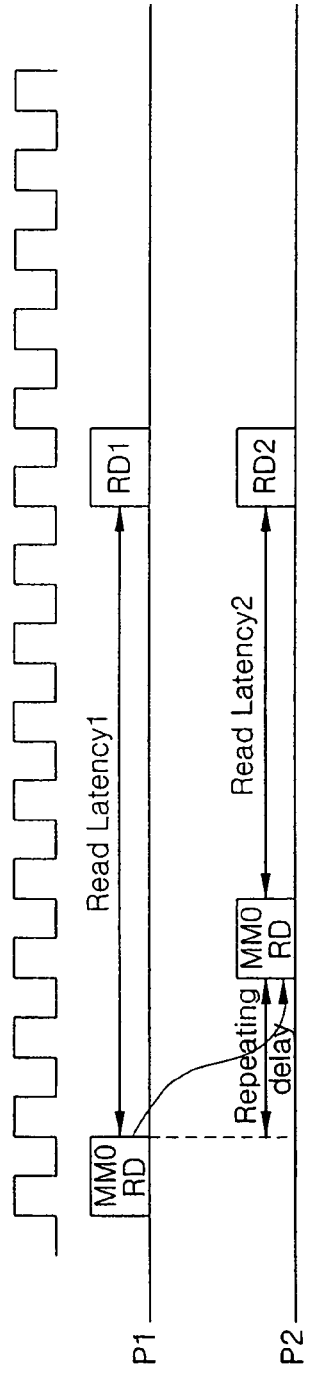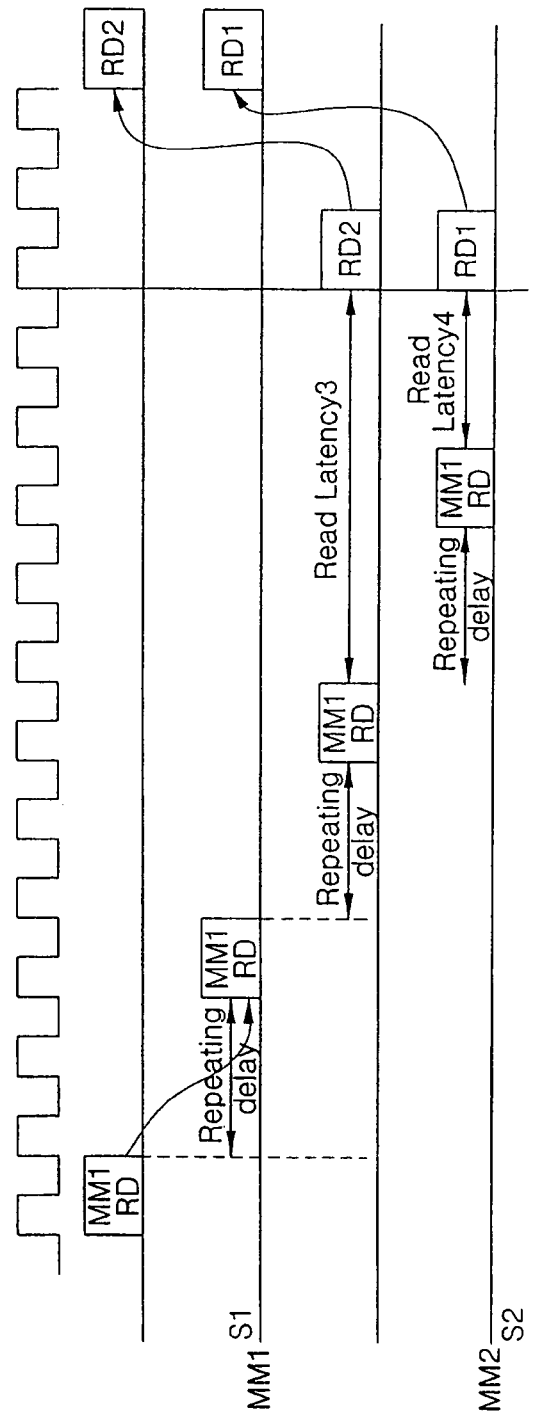

MEMORY SYSTEM HAVING POINT-TO-POINT (PTP) AND POINT-TO-TWO-POINT (PTTP) LINKS BETWEEN DEVICES

RELATED APPLICATION

This application relies for priority on Korean Patent Application No. 2005-0120882, filed on Dec. 9, 2005, in the Korean Intellectual Property Office and Korean Patent Application No. 2006-0005103, filed on Jan. 17, 2006, in the Korean Intellectual Property Office, the contents of which applications are incorporated herein in their entirety by reference.

FIELD OF THE INVENTION

The invention relates to a memory system and more particularly, to a memory system having a point-to-point (PTP) link structure between memory devices.

BACKGROUND OF THE INVENTION

FIG. 1 contains a block diagram of a conventional memory system 10 having a plurality of memory devices M0-Mm, e.g., m=7, on a plurality of memory modules MM0-MMn, 14, 12, connected to a controller 16. The number m of memory devices M0-Mm on each memory module MM0-MMn is determined with respect to the system bus width. For example, if the system bus width is ×64 and the memory devices have a ×8 DQ bus, each memory module MM0-MMn has eight memory devices M0-M7. Data signal lines DQ0-7, DQ8-15, . . . , DQ56-63 have multi-drop links, such that the memory devices share the data signal lines. The capacitive load of the data lines affects the operation speed of the memory system. For example, 8 SDRAM, 4DDR (double data rate), 2DDR2 and 2DDR3 operational configurations typically may be connected together to respective data signal lines. As the operating speed of such systems increases, it becomes important to reduce capacitive loading of the data signal lines to avoid the degradation of operation speed introduced by the capacitive loading.

The command/address (C/A) signal lines C/A0 and C/A1 have multi-drop links, so that memory devices M0-Mm on the same module MM0-MMn share the same C/A signal line. In general, 8 or 4 memory devices share a single C/A line, depending on the system bus speed. For higher bus speeds, 8 memory devices typically share a common C/A line.

At present, the speed of a C/A line is slower than that of a data DQ line because of the loading effects. For DDR operation, the C/A bus is being operated at single data rate (SDR), half of the DQ speed. For higher speed operation, it will also be important to reduce capacitive loading and stub of the C/A line.

For a high-speed memory system, i.e., a system operating at more than 2 Gbps, a point-to-point (PTP) link, as opposed to a multi-drop link, between memory devices and between the controller and memory devices has been studied to reduce capacitive loading and stub of each signal line to meet high-speed operational requirements. For a high-density memory system supporting the PTP link, a plurality of memory modules are needed to support the memory application such as server or networking, but each memory module comprising the PTP link should have an input/output I/O module tab for each signal line. This causes an increase in the number of tabs, making it difficult to design and produce a suitable memory module. An approach in a high-density memory system supporting PTP without increasing the number of module tabs is to use stacked memories on a single memory module.

If stacked memories mounted on one memory module are adopted, some problems are expected. For example, the thermal management between an upper memory and a lower memory would be a difficult issue to resolve. Also, signal routing between an upper memory and a lower memory would become very complex and difficult to implement, and can lead to an increase in memory package size. Also, it would be difficult to increase the density of the memory system while maintaining the PTP link.

SUMMARY OF THE INVENTION

The present invention is directed to an approach to providing a memory system having a point-to-two-point (referred to herein as "1P2P") link for merged write data and command/address (WR/CA) signal lines and a point-to-point (referred to herein as "1P1P") link for read data (DQ) signal lines.

The present invention provides a memory package capable of supporting a PTP link without an increase in memory package size. The present invention also provides a memory system having a PTP link among memory devices. These features are provided without increasing the number of connector pins in the memory module.

According to a first aspect, the invention is directed to a memory system, comprising first and second primary memories and first and second secondary memories coupled to the first and second primary memories, respectively, the coupling comprising at least one point-to-point connection. At least one memory module has at least two of the first and second primary and first and second secondary memories. A first connection element connects the memory module to a mother board. A second connection element connects at least one other of the first and second primary and first and second secondary memories to the mother board. At least one of the memories on the first memory module is coupled to at least one of the other memories.

In one embodiment, the first connection element is a connector connecting the memory module to the mother board.

In one embodiment, the second connection element comprises solder for fixedly attaching the at least one other of the first and second primary and first and second secondary memories to the mother board.

In one embodiment, the first primary memory and the second primary memory are affixed to the first memory module.

In one embodiment, the first primary memory and the first secondary memory are affixed to the first memory module.

In one embodiment, the first primary memory and the second primary memory are soldered to the mother board.

In one embodiment, the first primary memory and the first secondary memory are soldered to the mother board.

The memory system can further include a second memory module to which at least two others of the first and second primary and first and second secondary memories are attached. The second connection element can be a connector connecting the second memory module to the mother board. A flexible conductor element can connect the first and second memory modules. The flexible conductor element can carry command/address (CA) signals and/or data signals. The first primary memory and the second primary memory can be affixed to the first memory module. The first primary memory and the first secondary memory can be affixed to the first memory module. The first secondary memory and the second secondary memory can be affixed to the second memory module. The second primary memory and the second secondary memory can be affixed to the second memory module.

The memory system can further include a controller coupled to at least one of the first and second primary memories. The controller can be coupled to the at least one primary memory via a point-to-point link. The controller can be coupled to the first and second primary memories via a point-to-two-point link. The controller can transmit command/address (CA) signals to both of the primary memories. In one embodiment, during an access to one of the secondary memories, one of the primary memories repeats command/address signals from the controller to the one of the secondary memories being accessed. In one embodiment, a first half of data being accessed is transferred to the controller by one of the primary and secondary memories, and a second half of the data being accessed is transferred to the controller by another of the primary and secondary memories. In one embodiment, a first half of data being accessed is transferred to the controller by one of the secondary memories, and a second half of the data being accessed is transferred to the controller the other of the secondary memories.

According to another aspect, the invention is directed to a memory system comprising first and second primary memories and a controller for transmitting signals to the first and second primary memories, the signals being transmitted to the first and second memories by a point-to-two-point link.

In one embodiment, the signals comprise command/address (CA) signals. First and second secondary memories can be coupled to the first and second primary memories, respectively. Coupling between the primary and secondary memories can include at lest one point-to-point connection. The memory system can further include a first memory module having at least two of the first and second primary and first and second secondary memories and a second memory module having at least the other two of the first and second primary and fist and second secondary memories.

A flexible conductor element may connect the first and second memory modules. The flexible conductor element can carry command/address (CA) signals and/or data signals.

In one embodiment, the controller transmits command/address (CA) signals to both of the primary memories. In one embodiment, during an access to one of the secondary memories, one of the primary memories repeats command/address (CA) signals from the controller to the one of the secondary memories being accessed. A first half of data being accessed can be transferred to the controller by one of the primary and secondary memories, and a second half of the data being accessed is transferred to the controller by another of the primary and secondary memories. A first half of data being accessed can be transferred to the controller by one of the secondary memories, and a second half of the data being accessed is transferred to the controller the other of the secondary memories.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 3A and 3B contain timing diagrams illustrating the timing of a read operation in accordance with the embodiment of the invention illustrated in FIG. 2A.

FIG. 4A is a schematic block diagram of a memory system in accordance with another embodiment of the invention.

FIGS. 10A and 10B contain timing diagrams of a read operation for the embodiment of the invention illustrated in FIGS. 8A and 9.

FIGS. 14A and 14B contain timing diagrams of a read operation for the embodiment of the invention illustrated in FIG. 13A.

DETAILED DESCRIPTION OF PREFERRED EMBODIMENTS OF THE INVENTION

Figure 1:
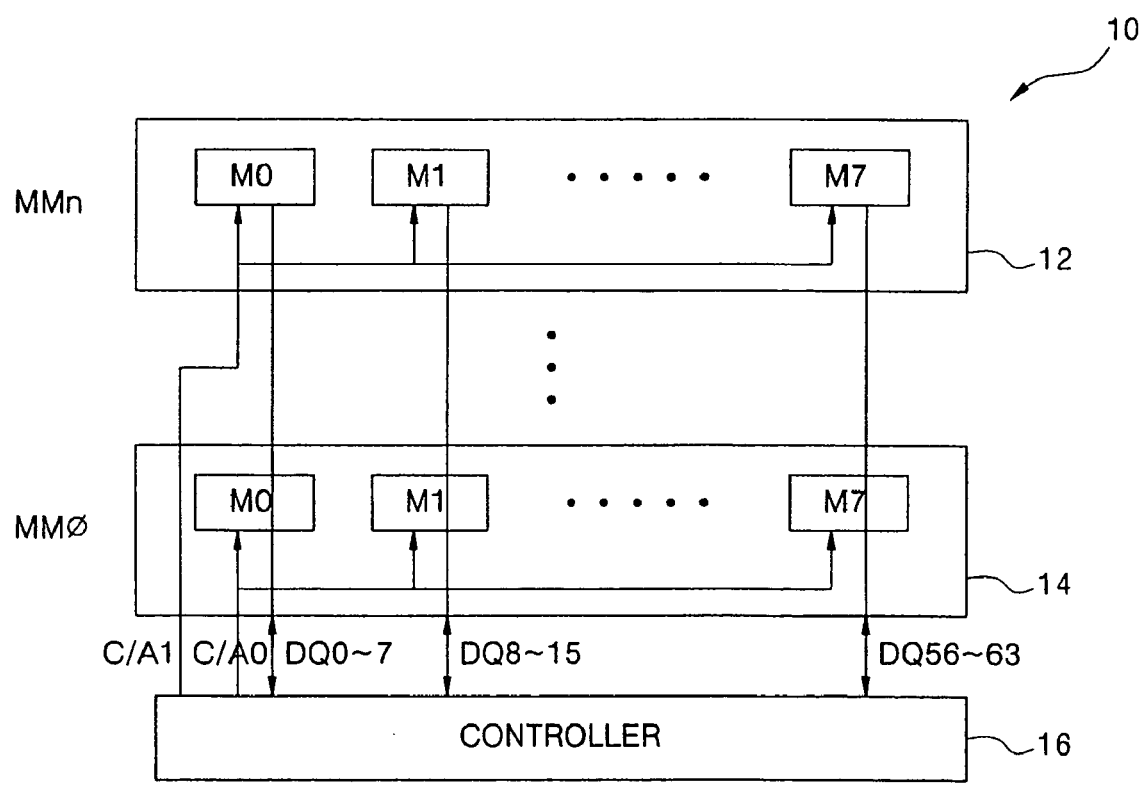
FIG. 1 contains a block diagram of a conventional memory system having a plurality of memory devices on a plurality of memory modules.
Figure 2A:
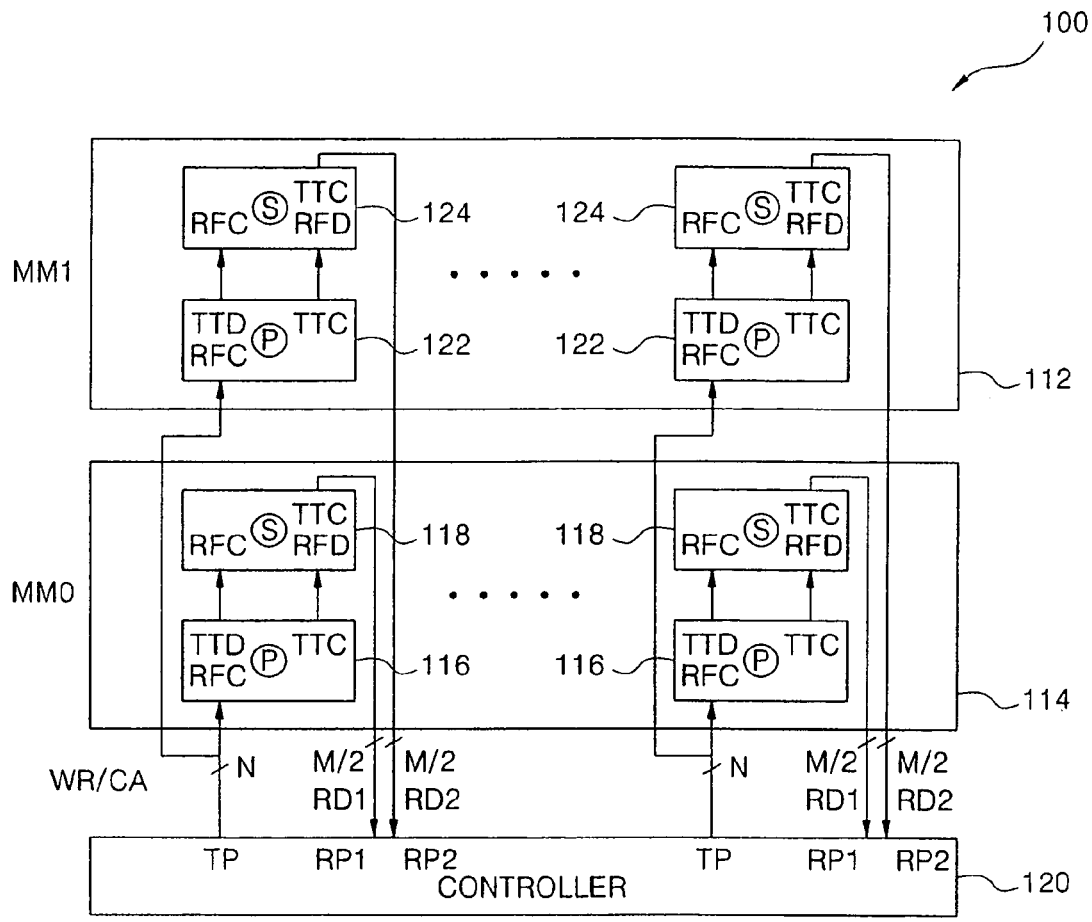
FIG. 2A contains a schematic block diagram of a memory system in accordance with an embodiment of the invention.

FIG. 2A contains a schematic block diagram of a memory system 100 in accordance with an embodiment of the invention. The memory system 100 of FIG. 2A includes a memory controller 120 and two memory modules 114 (MM0) and 112 (MM1). In this case, the memory link to the controller is divided into the two separate memory modules MM0, MM1, rather than a single memory module. Each of the memory modules MM0, MM1 includes a group of primary (P) memories 116, 122 connected to a respective group of secondary (S) memories 118, 124 in the same planar structure. WR/CA signal lines are connected from a transmitting port TP of the controller 120 to the primary memories 116, 122. In this embodiment, the WR/CA signals are merged write data signals and command/address signals. That is, command/address signals and write data signals share the WR/CA signal lines. Read data signals RD1, RD2 are connected from the secondary memories 118, 124, respectively, to receiving ports RP1, RP2, respectively, of the controller 120.

Each of the primary (P) and secondary (S) memories includes a plurality of ports. In the illustrated embodiment, each of the primary (P) memories includes a receive-from-controller (RFC) port, a transmit-to-memory (TTD) port and a transmit-to-controller (TTC) port. Each of the secondary (S) memories includes a receive-from-controller (RFC) port, a receive-from-memory (RFD) port and a transmit-to-controller (TTC) port. In the primary (P) memories, the RFC port receives WR/CA signals from the controller 120; the TTD port transfers WR/CA signals to the connected secondary (S) memory; and the TTC port transmits primary memory read data to the secondary (S) memory. In the secondary (S) memories, the RFC port receives WR/CA signals from the connected primary (P) memory; the RFD port receives primary memory read data from the connected primary memory; and the TTC port transmits secondary memory read data or primary read data from the connected primary memory to the controller 120.

In this embodiment, the link from the transmitting port TP of the controller 120 transmits WR/CA signals to the primary memories 116, 122 via a point-to-two-point (PTTP or 1P2P) link, meaning that the WR/CA signal lines are simultaneously connected from the TP port of the controller to both of the two RFC ports of the primary memories 116, 122. In this embodiment, the links from the secondary memories 118, 124 are point-to-point (PTP or 1P1P) links.

WR/CA signals for a primary memory access are transmitted to the primary memories 116, 122 via the PTTP (1P2P) link of the invention. In the case of a primary read operation, read data is transmitted by the primary memory 116, 122 out of the TTC port to the connected secondary memory 118, 124. The secondary memory 118, 124 then transmits or repeats the primary read data to the controller 120 out of the TTC port of the secondary memory 118, 124 via the PTP link. In the case of a secondary memory access, WR/CA signals are transmitted to the primary memories 116, 122 via the PTTP (1P2P) link of the invention. The WR/CA signals are transferred or repeated to the secondary memories 118, 124 via the TTD port of the primary memories 116, 122 and the RFC port of the secondary memories 118, 124. In the case of a secondary memory read operation, the read data is transmitted to the controller 120 out of the TTC port of the secondary memory 118, 124 via the PTP (1P1P) link.

As noted above, in this embodiment, the memory link to the controller is divided into the two separate memory modules MM0, MM1, rather than a single memory module. The PTTP (1P2P) link for the WR/CA signals provides for the WR/CA signals to be transmitted to both primary memories 116, 122 simultaneously. Also, according to this embodiment, if read data is M bits, each secondary memory 118, 124 provides half of the data, i.e., M/2 bits, to the controller 120. That is, the read data RD1 transmitted from the secondary memory 118 to the receive port RP1 of the controller 120 is M/2 bits. The read data RD2 transmitted from the secondary memory 124 to the receive port RP2 of the controller 120 is also M/2 bits.

Figure 2B:
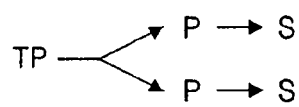
FIG. 2B contains a schematic diagram illustrating the configurations of the links in the memory system of FIG. 2A.

FIG. 2B contains a schematic diagram illustrating the configurations of the links in the memory system 100 of FIG. 2A. As indicated in the diagram of FIG. 2B, a PTTP link connects the transmitting port TP to two primary memories P (116, 122), and PTP links connect each of the primary memories P (116, 122) to a corresponding secondary memory S (118, 124). PTP links connect each primary memory P (116, 122) to a corresponding secondary memory S (118, 124) and to a corresponding receiving port RP1, RP2.

FIGS. 3A and 3B contain timing diagrams illustrating the timing of a read operation in accordance with the embodiment of the invention illustrated in FIG. 2. Specifically, FIG. 3A illustrates the timing of a read operation performed on a primary (P) memory 116, 122, and FIG. 3B illustrates the timing of a read operation performed on a secondary (S) memory 118, 124.

Referring to FIG. 3A, the primary memories 116, 122 of the memory modules MM0, MM1 (MM0 P and MM1 P) operate simultaneously in response to the primary read command (RDP), such that each primary memory outputs half of the requested data RD1 and RD2 to the respective secondary memories 118, 124 after a predetermined read latency. The requested data RD1 and RD2 is repeated by respective secondary memories 118, 124 to the controller 120.

Referring to FIG. 3B, the secondary memories 118, 124 of the memory modules MM0, MM1 (MM0 S and MM1 S) operate simultaneously in response to the secondary read command (RDS) which is received from the respective primary memories 116, 122 after a repeating delay. Then each secondary memory outputs half of the requested data RD1 and RD2 to the controller 120 after the predetermined read latency. As noted in both FIGS. 3A and 3B in the cases of both a primary read and a secondary read, all of the read data is available to the controller at the same time, with read latency and repeating delay, even in the case of dividing the memory into two memory modules MM0, MM1, according to the invention.

FIG. 4A is a schematic block diagram of a memory system 200 in accordance with another embodiment of the invention. FIG. 5 is a schematic diagram of the memory system 200 of FIG. 4A, illustrating the physical configuration of the memory system 200.

Referring to FIGS. 4A and 5, the memory system 200 includes a pair of memory modules 214 (MM0) and 212 (MM1) connected at lower conductive tabs 236 and 230, respectively, to a mother board 242 at connectors 246 and 244, respectively, on the mother board 242. Two primary memories 216, 222 (P1, P2) are mounted on module MM0, and two secondary memories 218, 224 (S1, S2) are mounted on module MM1. The RFC ports of primary memories P1 and P2 are connected together via printed circuit wiring on the module MM0 circuit board. The primary memories P1 and P2 are connected to the secondary memories S1 and S2 via a flexible cable 240 having printed conductors connected between the upper tabs 232 of the module MM1 and the upper tabs 234 of the module MM0.

In the embodiment of FIGS. 4A and 5, the logical connections among the primary memories, the secondary memories and the controller 220 are the same as those of the embodiment of FIG. 2A. That is, the embodiment of FIGS. 4A and 5 implements the memory system functional operations as described above in connection with the embodiment of FIG. 2A, including but not limited to the repeating of WR/CA signals from primary memory to secondary memory and repeating of read data from a primary memory by a secondary memory to the controller. The WR/CA signals are transmitted at the transmitting port TP by the controller 220 in a PTTP (1P2P) link to both primary memories P1, P2. The signals being transferred from the primary memories P1, P2 to the secondary memories S1, S2 are transmitted over the flexible cable 240 between the modules MM0, MM1. Read data RD1 signals are transmitted via PTP (1P1P) link out of the TTC port of the secondary memory S1 218 and are routed through the memory module MM1 on lines 241 to the lower tabs 230, through the connector 244 and to the receiving port RP1 of the controller 220 through the mother board 242. Read data RD2 signals are transmitted via PTP (1P1P) link out of the TTC port of the secondary memory S2 224 and are routed through the memory module MM1 on lines 243 to the lower tabs 230, through the connector 244 and to receiving port RP2 of the controller 220 through the mother board 242.

Figure 4B:
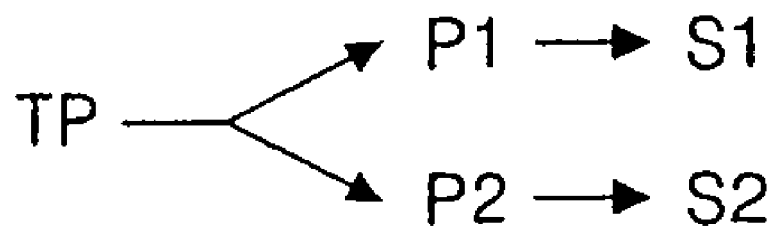
FIG. 4B contains a schematic diagram illustrating the configurations of the links in the memory system 200 of FIG. 4A.
Figure 5:
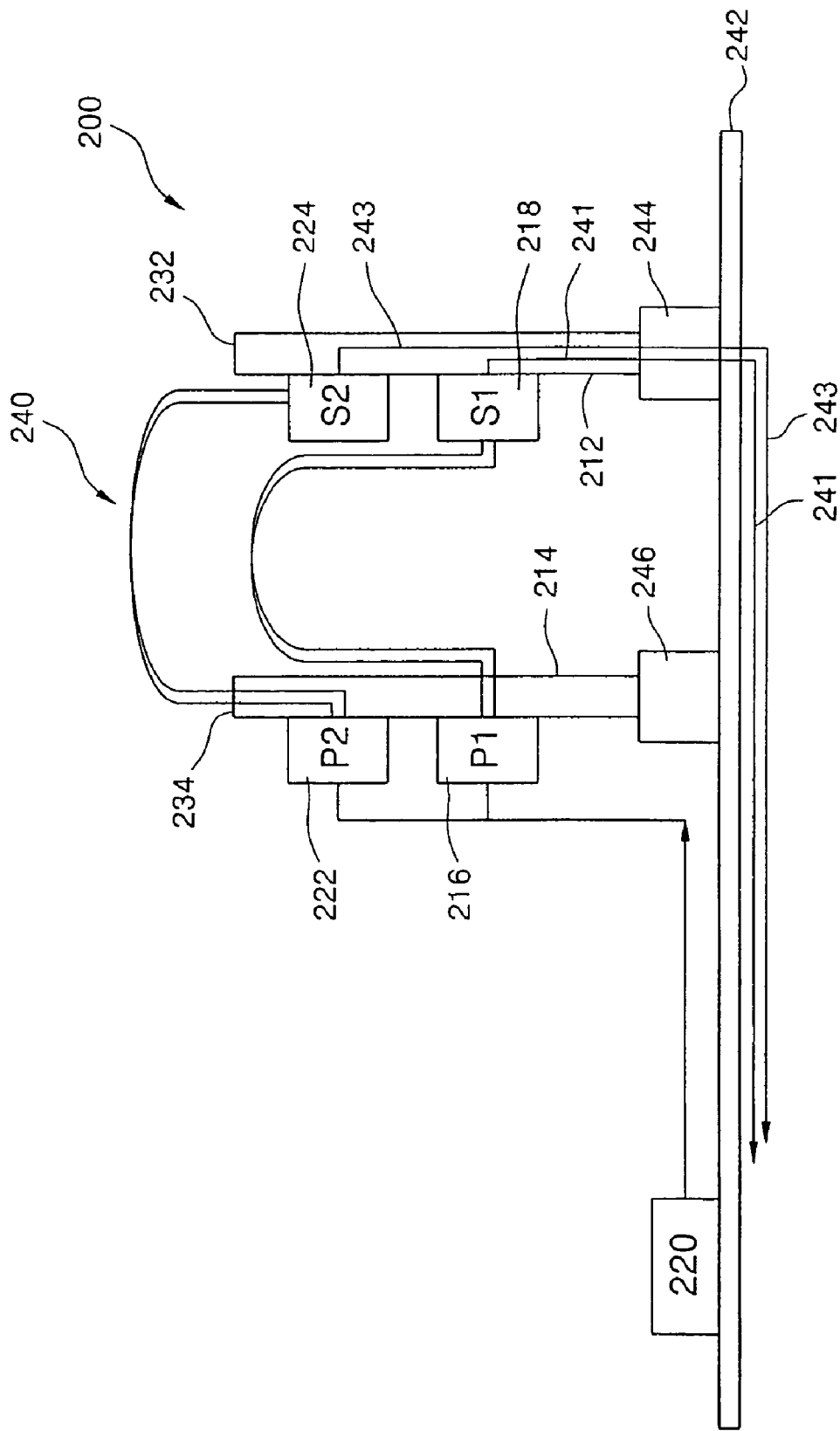
FIG. 5 is a schematic diagram of the memory system of FIG. 4A, illustrating the physical configuration of the memory system.

FIG. 4B contains a schematic diagram illustrating the configurations of the links in the memory system 200 of FIG. 4A. As indicated in the diagram of FIG. 4B, a PTTP link connects the transmitting port TP to two primary memories P1 (216) and P2 (222), and PTP links connect each of the primary memories P1 (216) and P2 (222) to a corresponding secondary memory S1 (218) and S2 (224). PTP links connect each primary memory P1 (216) and P2 (222) to a corresponding secondary memory S1 (218) and S2 (224) and to a corresponding receiving port RP1, RP2.

Figure 6A:
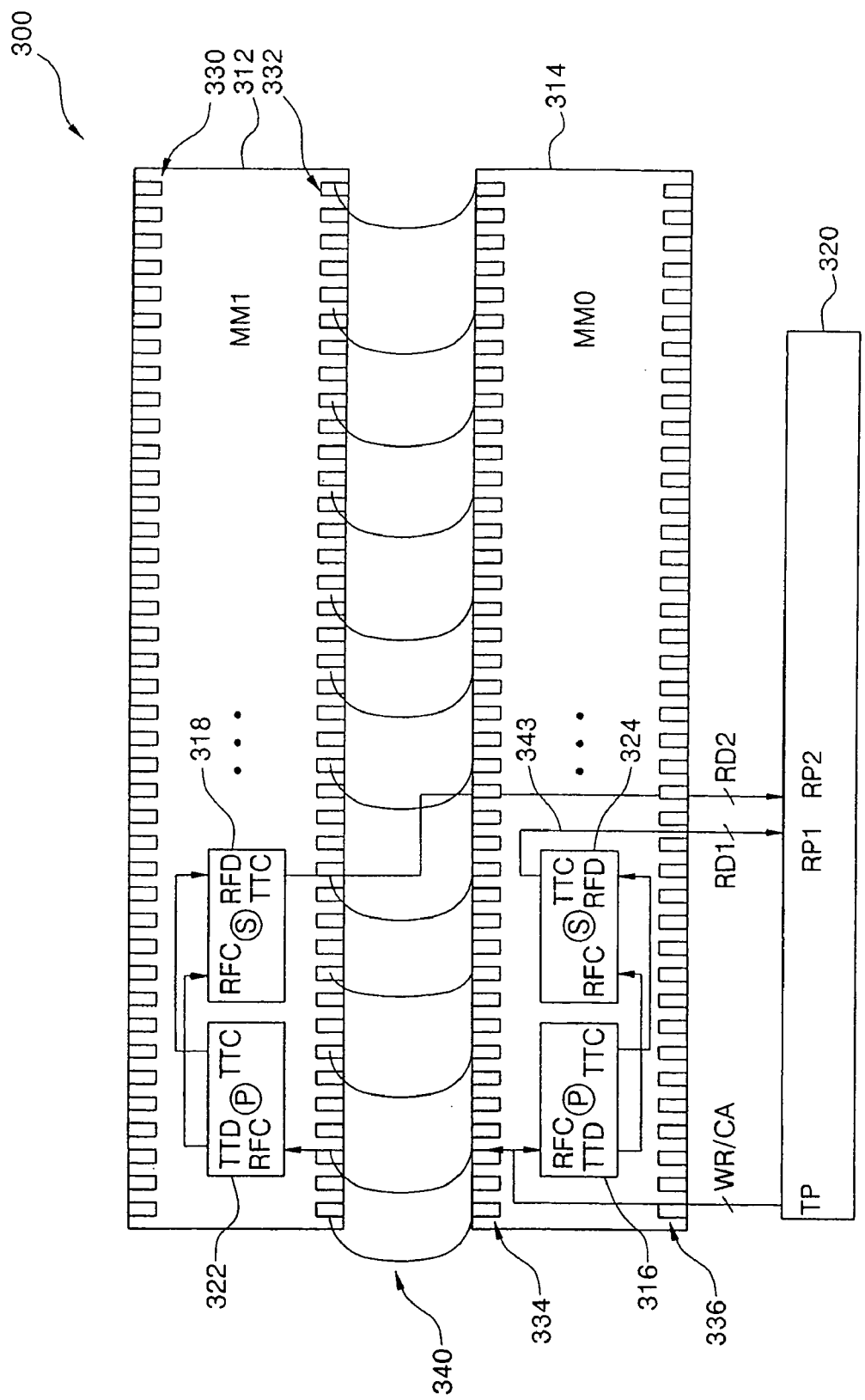
FIG. 6A is a schematic block diagram of a memory system in accordance with another embodiment of the invention.
Figure 7:
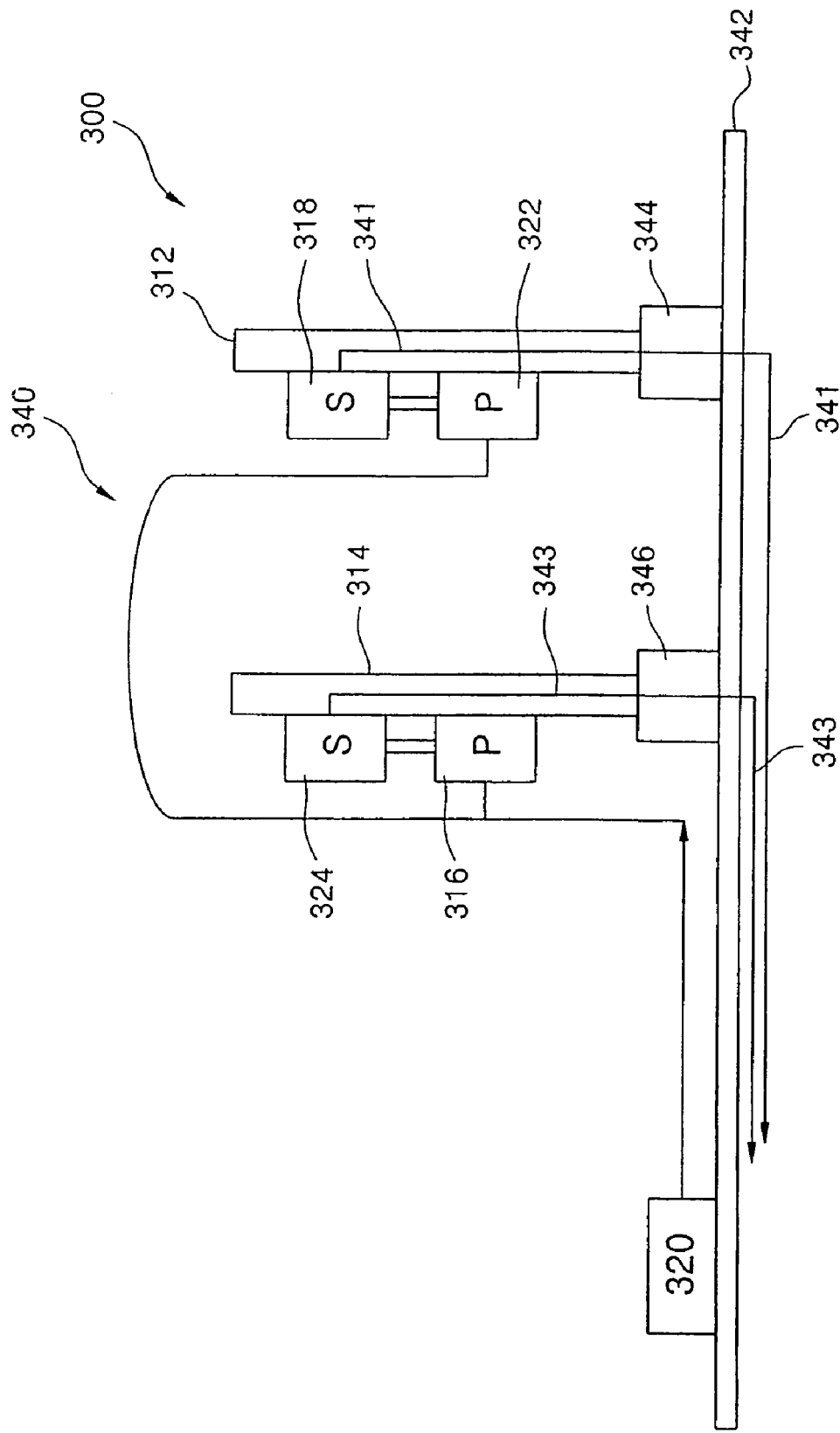
FIG. 7 is a schematic diagram of the memory system of FIG. 6A, illustrating the physical configuration of the memory system.

FIG. 6A is a schematic block diagram of a memory system 300 in accordance with another embodiment of the invention. FIG. 7 is a schematic diagram of the memory system 300 of FIG. 6A, illustrating the physical configuration of the memory system 300.

In the embodiment of FIGS. 6A and 7, the memory system 300 includes a pair of memory modules 314 (MM0) and 312 (MM1) connected at lower conductive tabs 336 and 330, respectively, to a mother board 342 at connectors 346 and 344, respectively, on the mother board 342. A primary memory 316 and a secondary memory 324 are mounted on module MM0, and a primary memory 322 and a secondary memory 324 are mounted on module MM1. The primary memory 316 and the secondary memory 324 are connected together via printed circuit wiring on the module MM0 circuit board, and the primary memory 322 and the secondary memory 318 are connected together via printed circuit wiring on the module MM1 circuit board. The primary memory 316 is connected to the primary memory 322 via a flexible cable 340 having printed conductors connected between the upper tabs 332 of the module MM1 and the upper tabs 334 of the module MM0.

In the embodiment of FIGS. 6A and 7, the logical connections among the primary memories, the secondary memories and the controller 320 are the same as those of the embodiment of FIG. 2A. That is, the embodiment of FIGS. 6A and 7 implements the memory system functional operations as described above in connection with the embodiment of FIG. 2A, including but not limited to the repeating of WR/CA signals from primary memory to secondary memory and repeating of read data from a primary memory by a secondary memory to the controller. The WR/CA signals are transmitted at the transmitting port TP by the controller 320 in a PTTP (1P2P) link to both primary memories 316, 322. The signals being transferred from the primary memory 316 to the secondary memory 324 are transferred on circuit wiring printed on the memory module MM0, and the signals being transferred from the primary memory 322 to the secondary memory 318 are transferred on circuit wiring printed on the memory module MM1. The WR/CA signals in the PTTP link are transferred to the primary memory 322 along the flexible cable 340. Read data RD1 signals are transmitted via PTP (1P1P) link out of the TTC port of the secondary memory 324 and are routed through the memory module MM0 on lines 343 through the connector 346 to the receiving port RP1 of the controller 320 through the mother board 342. Read data RD2 signals are transmitted via PTP (1P1P) link out of the TTC port of the secondary memory 318 and are routed through the memory module MM1 on lines 341 to the lower tabs 330, through the connector 344 to receiving port RP2 of the controller 320 through the mother board 342.

Figure 6B:
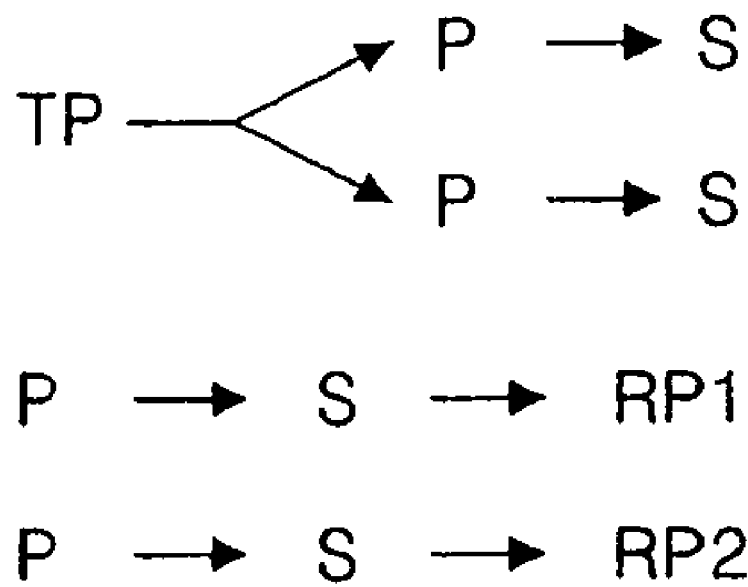
FIG. 6B contains a schematic diagram illustrating the configurations of the links in the memory system of FIG. 6A.

FIG. 6B contains a schematic diagram illustrating the configurations of the links in the memory system 300 of FIG. 6A. As indicated in the diagram of FIG. 6B, a PTTP link connects the transmitting port TP to two primary memories P (316, 322), and PTP links connect each of the primary memories P (316, 322) to a corresponding secondary memory S (324, 318). PTP links connect each primary memory P (316, 322) to a corresponding secondary memory S (324, 318) and to a corresponding receiving port RP1, RP2.

Figure 8A:
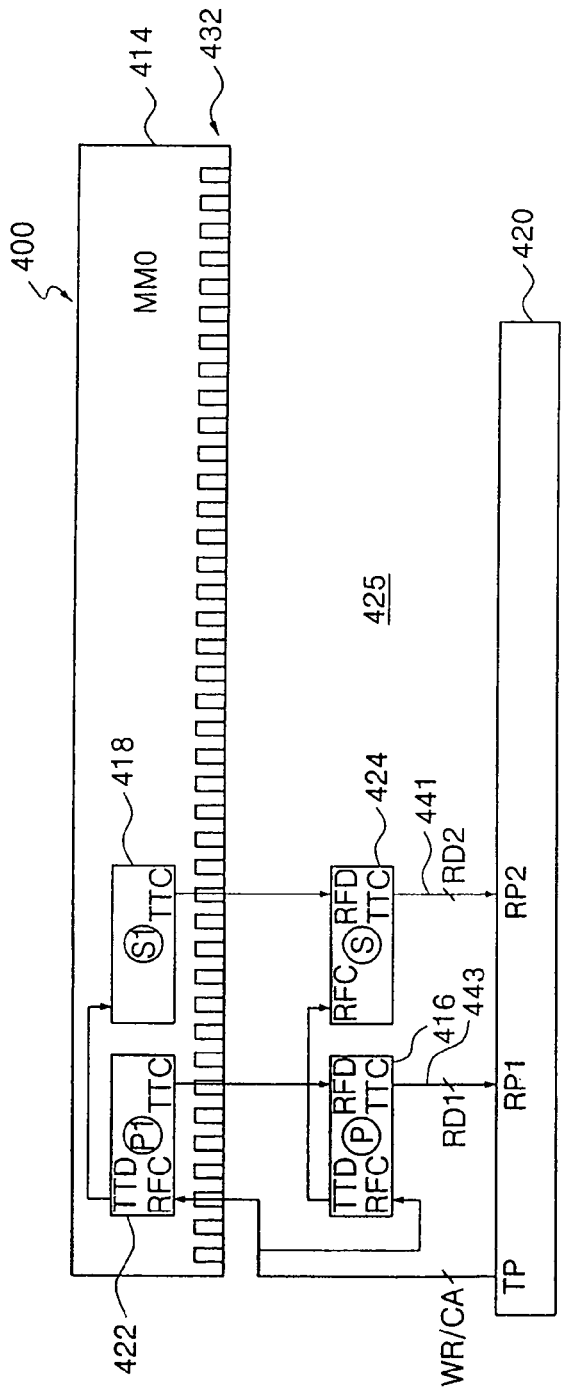
FIG. 8A is a schematic block diagram of a memory system in accordance with another embodiment of the invention.
Figure 9:
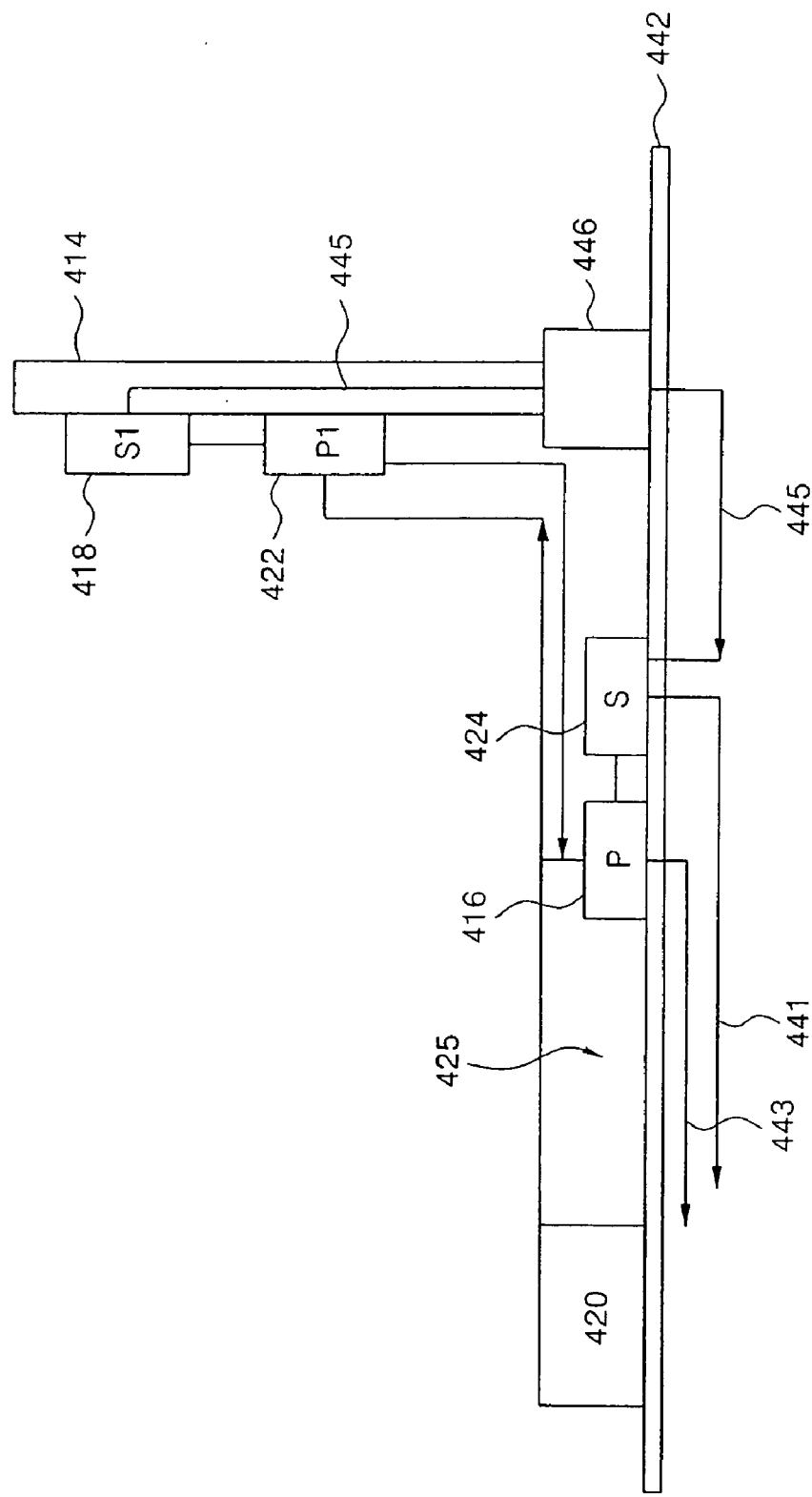
FIG. 9 is a schematic diagram of the memory system of FIG. 8A, illustrating the physical configuration of the memory system.

FIG. 8A is a schematic block diagram of a memory system 400 in accordance with another embodiment of the invention. FIG. 9 is a schematic diagram of the memory system 400 of FIG. 8A, illustrating the physical configuration of the memory system 400.

In the embodiment of FIGS. 8A and 9, the memory system 400 includes a single memory module 414 (MM0) connected at lower conductive tabs 432 to a mother board 442 at connector 446 on the mother board 442. A primary memory (P1) 422 and a secondary memory (S1) 418 are mounted on module MM0, and a primary memory (P) 416 and a secondary memory (S) 424 are hard mounted such as by soldering on a soldering area 425 of the mother board 442. The primary memory 416 and the secondary memory 424 are connected together via printed circuit wiring on the mother board 442. The primary memory 422 and the secondary memory 418 are connected together via printed circuit wiring on the module MM0 circuit board. The primary memory 416 is connected to the primary memory 422 via printed circuit wiring on the mother board 442 through the connector 446, through the circuit board of the memory module 414. The secondary memory 424 is connected to the secondary memory 418 via printed circuit wiring on the mother board 442 through the connector 446, through the circuit board of the memory module 414.

In the embodiment of FIGS. 8A and 9, the logical connections among the primary memories, the secondary memories and the controller 420 are the same as those of the embodiment of FIG. 2A. That is, the embodiment of FIGS. 8A and 9 implements the memory system functional operations as described above in connection with the embodiment of FIG. 2A, including but not limited to the repeating of WR/CA signals from primary memory to secondary memory and repeating of read data from a primary memory by a secondary memory to the controller. The WR/CA signals are transmitted at the transmitting port TP by the controller 420 in a PTTP (1P2P) link to both primary memories 416, 422. The signals being transferred from the primary memory 416 to the secondary memory 424 are transferred on circuit wiring printed on the mother board 420, and the signals being transferred from the primary memory 422 to the secondary memory 418 are transferred on circuit wiring printed on the memory module MM0. The WR/CA signals in the PTTP link are transferred to the primary memory 422 along circuit wiring printed on the mother board 442, through the connector 446 and circuit wiring printed on the circuit board of the memory module MM0. The WR/CA signals in the PTTP link are transferred to the primary memory 416 along circuit wiring printed on the mother board 442. Read data RD1 signals are transmitted via PTP (1P1P) link out of the TTC port of the primary memory 416 and are routed through the mother board 442 on lines 443 to the receiving port RP1 of the controller 420. Read data RD2 signals are transmitted out of the TTC port of the secondary memory 424 and are routed through the mother board 442 on lines 441 to receiving port RP2 of the controller 420.

It should be noted that, in the embodiment of FIGS. 8A and 9, the memories on the mother board 442 have shorter read paths that the memories on the memory module MM0. As a result, the read latency of the memories on the mother board 442 may be set to be longer than that of the memories on the memory module MM0 such that the read data is received at the controller 420 at or about the same time.

Figure 8B:
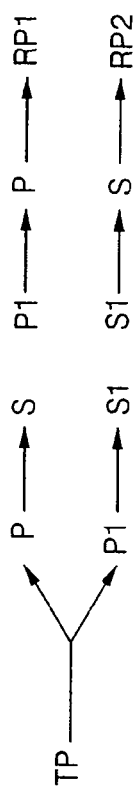
FIG. 8B contains a schematic diagram illustrating the configurations of the links in the memory system of FIG. 8A.

FIG. 8B contains a schematic diagram illustrating the configurations of the links in the memory system 400 of FIG. 8A. As indicated in the diagram of FIG. 8B, a PTTP link connects the transmitting port TP to two primary memories P (416) and P1, (422), and PTP links connect each of the primary memories P (416) and P1 (422) to a corresponding secondary memory S (424) and S1 (418). PTP links connect the primary memory P1 (422) to the primary memory P (416) to the corresponding receiving port RP1. PTP links connect the secondary memory S1 (418) to the secondary memory S (424) to the corresponding receiving port RP2.

FIGS. 10A and 10B contain timing diagrams of a read operation for the embodiment of the invention illustrated in FIGS. 8A and 9. Specifically, FIG. 10A illustrates the timing of a read operation (RD) performed on the primary (P) memory 416 and the secondary (S) memory 424 on the mother board 442, and FIG. 10B illustrates the timing of a read operation MM0 RD performed on the primary (P1) memory 422 and the secondary (S1) memory 418 on the memory module MM0.

Referring to FIG. 10A, the primary memory 416 receives the RD and repeats the RD1 to the secondary memory 424 after the repeating delay. The primary memory 416 reads out RD1 after a predetermined read latency 1 and the secondary memory 424 S reads out RD2 after a predetermined read latency 2. To receive the read data RD1 and RD2 at the controller 420 at or about the same time, The primary memory has a longer read latency 1 than the read latency 2 of the secondary memory. Referring to FIG. 10B, the primary memory P1 receives the read command MM0 RD and repeats it to the secondary memory S1 after a repeating delay. The primary memory P1 reads out the RD1 to the primary memory P after read latency 1. The secondary memory S1 reads out the RD2 to the secondary memory S after read latency 2. P and S repeats the RD1 and RD2 respectively to the controller. The controller receives the RD1 and RD2 after the repeating delay.

In terms of signal flow, referring to FIGS. 8A, 8B, 9, 10A and 10B, WR/CA signals from the controller 420 are sent to primary memories P and P1. Primary memory P repeats the WR/CA signals to the secondary memory S, and primary memory P1 repeats the WR/CA signals to the secondary memory S1. In the case of reading data from primary memory P, read data RD1 is read out of primary memory P and sent to the controller 420. In the case of reading data from P1, read data RD1 is transferred to primary memory P, which repeats the read data RD1 to the controller 420. In the case of reading the secondary memory S, after the WR/CA signals are repeated to S by P, the read data RD2 is read from S and transferred to the controller 420. In the case of reading the secondary memory S1, after the WR/CA signals are repeated to S1 by P1, the read data RD2 is read from S1 and transferred to S. The read data is then repeated to the controller 420.

As noted in both FIGS. 10A and 10B, in the cases of both a read of the mother board memories and the module memories, all of the read data is available to the controller 420 at the same time, even in the case of dividing the memory into a memory module MM0 and mother board memories, according to the invention.

Figure 11:
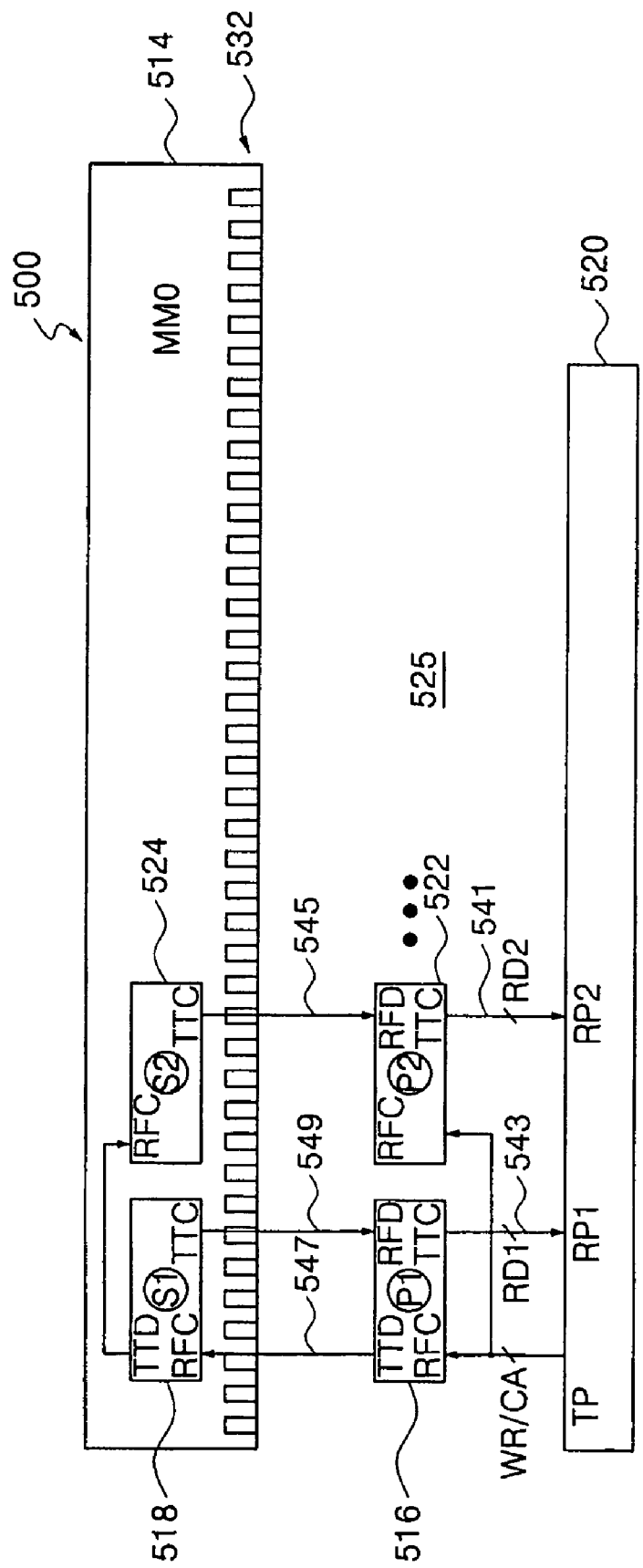
FIG. 11 is a schematic block diagram of a memory system in accordance with another embodiment of the invention.
Figure 12:
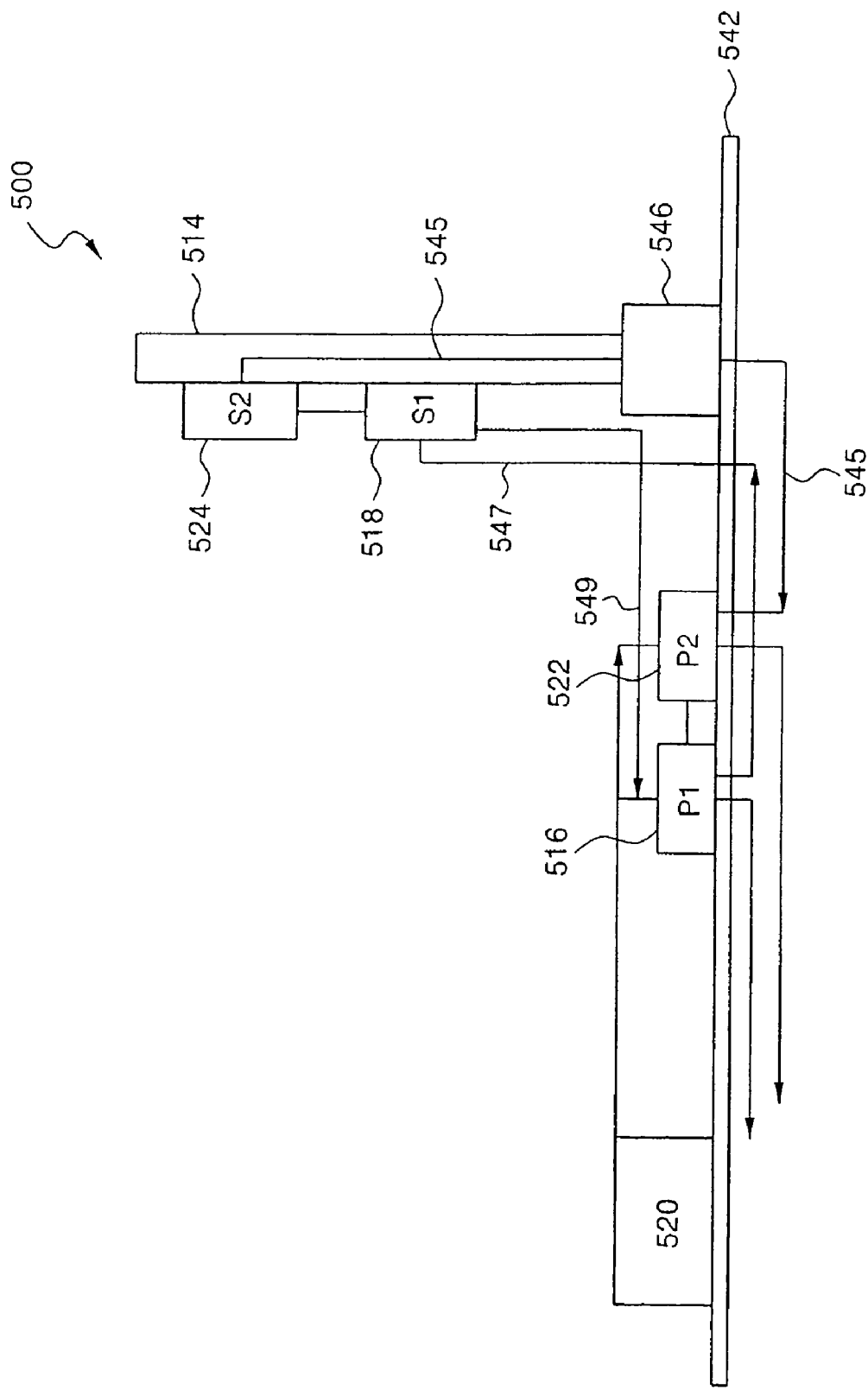
FIG. 12 is a schematic diagram of the memory system of FIG. 11, illustrating the physical configuration of the memory system.

FIG. 11 is a schematic block diagram of a memory system 500 in accordance with another embodiment of the invention. FIG. 12 is a schematic diagram of the memory system 500 of FIG. 11, illustrating the physical configuration of the memory system 500.

In the embodiment of FIGS. 11 and 12, the memory system 500 includes a single memory modules 514 (MM0) connected at lower conductive tabs 532 to a mother board 542 at connector 546 on the mother board 542. A secondary memory (S1) 518 and a secondary memory (S2) 524 are mounted on module MM0, and a primary memory (P1) 516 and a primary memory (P2) 522 are hard mounted such as by soldering on a soldering area 525 of the mother board 542. The primary memory P1 516 is connected to the secondary memory S1 518 via printed circuit wiring on the mother board 542 through the connector 546, through the circuit board of the memory module 514. The primary memory P2 522 is connected to the secondary memory S2 524 via printed circuit wiring on the mother board 542 through the connector 546, through the circuit board of the memory module 514.

In the embodiment of FIGS. 11 and 12, the logical connections among the primary memories, the secondary memories and the controller 520 are the same as those of the embodiment of FIG. 2A. That is, the embodiment of FIGS. 11 and 12 implements the memory system functional operations as described above in connection with the embodiment of FIG. 2A, including but not limited to the repeating of WR/CA signals from primary memory to secondary memory and repeating of read data from a primary memory by a secondary memory to the controller. The WR/CA signals are transmitted at the transmitting port TP by the controller 520 in a PTTP (1P2P) link to both primary memories 516, 522. The signals being transferred from the primary memory 516 to the primary memory 522 are transferred on circuit wiring printed on the mother board 542, and the signals being transferred from the secondary memory 518 to the secondary memory 524 are transferred on circuit wiring printed on the memory module MM0. The WR/CA signals in the PTTP link are transferred to the primary memories 516 and 522 along circuit wiring printed on the mother board 542. Read data RD1 signals are transmitted via PTP (1P1P) link out of the TTC port of the primary memory 516 and are routed through the mother board 542 on lines 543 to the receiving port RP1 of the controller 520. Read data RD2 signals are transmitted out of the TTC port of the primary memory 522 and are routed through the mother board 542 on lines 541 to receiving port RP2 of the controller 420.

In terms of signal flow, referring to FIGS. 11 and 12, WR/CA signals from the controller 520 are sent to primary memories P1 and P2. Then P1 repeats the WR/CA signals to the secondary memory S1, and secondary memory S1 repeats the WR/CA signals to the secondary memory S2. In the case of reading data from primary memories, read data RD1 and RD2 are output from P1 and P2 to the controller 520. In the case of reading data from secondary memories S1 and S2, read data RD1 and RD2 are output from S1 and S2 to primary memories P1 and P2, respectively, and then are repeated by P1 and P2 to transfer RD1 and RD2 to the controller 520.

The primary memory 516 is connected to the secondary memory 518 via lines 547, 549 printed on the mother board 542, passing through the connector 546 and through the circuit board on the memory module MM0. The primary memory 522 is connected to the secondary memory 524 via lines 545 printed on the mother board 542, passing through the connector 546 and through the circuit board on the memory module MM0.

It should be noted that, in the embodiment of FIGS. 11 and 12, the memories on the mother board 542 have shorter read paths that the memories on the memory module MM0. As a result, the read latency of the memories on the mother board 542 may be set to be longer than that of the memories on the memory module MM0 such that the read data is received at the controller 520 at or about the same time.

Figure 13A:
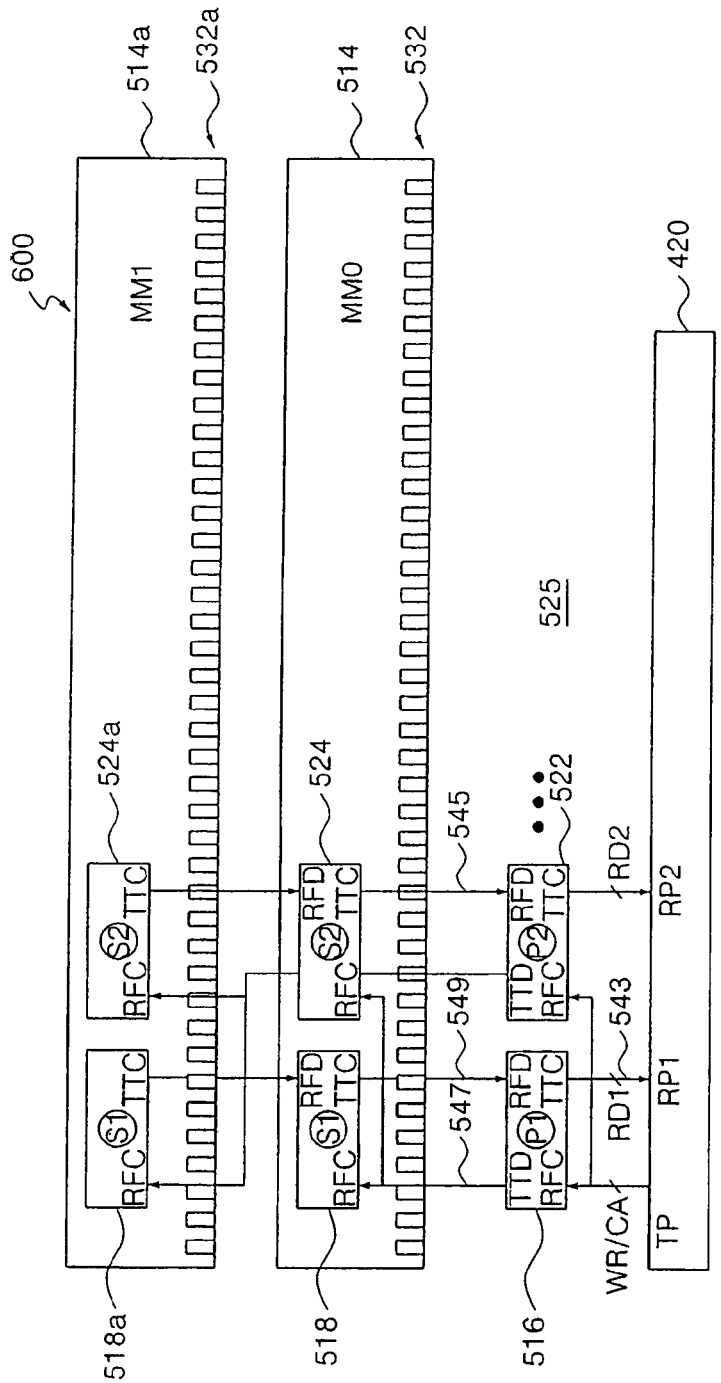
FIG. 13A is a schematic block diagram of a memory system in accordance with another embodiment of the invention.
Figure 13B:
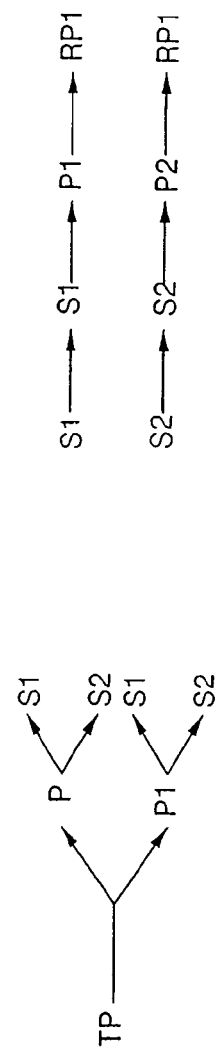
FIG. 13B contains a schematic diagram illustrating the configurations of the links in the memory system of FIG. 13A.

FIG. 13A is a schematic block diagram of a memory system 600 in accordance with another embodiment of the invention. The memory system 600 is the same as that of FIGS. 11 and 12, except that an additional set of secondary memories 518a and 518b is included on a second memory module MM1 514a. In FIG. 13A, like reference numerals refer to like elements in FIGS. 11 and 12. As indicated in the diagram of FIG. 13B, a PTTP link connects the transmitting port TP to primary memories P1 and P2, and PTP links connect P1 and P2 to S1 (518, 518a) and S2 (524, 524a). PTP links connect S1 (518a) to S1 (518) to P1 to the receiving port RP1. PTP links connect S2 (524a) to S2 (524) to P2 to the receiving port RP2. In accordance with the invention, in general, any number of secondary memories can be added in like fashion to that shown in FIG. 13. This allows for the expansion of memory density while maintaining the PTTP (1P2P) WR/CA links and the PTP (1P2P) read data links.

FIGS. 14A and 14B contain timing diagrams of a read operation for the embodiment of the invention illustrated in FIG. 13A. Specifically, FIG. 14A illustrates the timing of a read operation (RD) performed on Memory module MM0, and FIG. 14B illustrates the timing of a read operation (MM1 RD) performed on memory module MM1.

Referring to FIG. 14A, the primary memory P1 and secondary memory S1 operate simultaneously in response to the read command MM0 RD, such that P1 outputs half of read data RD1 after read latency 1, and S1 outputs half of the data RD2 after repeating delay and read latency 2. Also, in the read operation of MM1, half of the read data RD1 is output after three repeating delays and read latency 4, and half of the read data RD2 is output after two repeating delays and read latency 3.

In all of the embodiments described herein, PTTP link or PTP link for WR/CA and RD1 and RD2 may be one of single-ended signaling and differential signaling. Differential signaling would be used in the case of high-speed operation. In the case of differential signaling, the number of pins used on the memory devices and modules would have to be modified to accommodate the increased number of connections.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A memory system, comprising:
   first and second primary memories;
   first and second secondary memories coupled to the first and second primary memories, respectively, the coupling comprising at least one point-to-point connection;
   a first memory module having at least two of the first and second primary and first and second secondary memories;
   a first connection element for connecting at least one memory of the first memory module to a mother board;
   a second connection element for connecting at least one of the memories except the at least two memories of the first memory module to the mother board;
   a controller coupled to at least one of the first and second primary memories for transmitting first signals and coupled to at least two of the first and second primary and secondary memories for receiving second signals; and
   wherein the second signals include data signals, a first half of the data signals being accessed is transferred to the controller by one of the primary and secondary memories, and a second half of the data signals being accessed is transferred to the controller by another of the primary and secondary memories.

2. The memory system of claim 1, wherein the first connection element is a connector connecting the memory module to the mother board.

3. The memory system of claim 1, wherein the second connection element comprises solder for fixedly attaching the at least one of the memories except the at least two memories of the first memory module to the mother board.

4. The memory system of claim 1, wherein the first primary memory and the second primary memory are affixed to the first memory module.

5. The memory system of claim 1, wherein the first primary memory and the first secondary memory are affixed to the first memory module.

6. The memory system of claim 1, wherein the first primary memory and the second primary memory are soldered to the mother board.

7. The memory system of claim 1, wherein the first primary memory and the first secondary memory are soldered to the mother board.

8. The memory system of claim 1, further comprising a second memory module to which the at least one of the memories except the at least two memories of the first memory module are attached.

9. The memory system of claim 8, wherein the second connection element is a connector connecting the second memory module to the mother board.

10. The memory system of claim 8, further comprising a flexible conductor element connecting the first and second memory modules.

11. The memory system of claim 10, wherein the flexible conductor element carries the first signals, and the first signals include command/address (CA) signals.

12. The memory system of claim 10, wherein the flexible conductor element carries the second signals, and the second signals include_data signals.

13. The memory system of claim 10, wherein the flexible conductor element carries the first signals and the second signals, and the first signals include command/address (CA) signals and the second signals include data signals.

14. The memory system of claim 8, wherein the first primary memory and the second primary memory are affixed to the first memory module.

15. The memory system of claim 8, wherein the first primary memory and the first secondary memory are affixed to the first memory module.

16. The memory system of claim 8, wherein the first secondary memory and the second secondary memory are affixed to the second memory module.

17. The memory system of claim 8, wherein the second primary memory and the second secondary memory are affixed to the second memory module.

18. The memory system of claim 1, wherein the controller is coupled to the at least one primary memory via a point-to-point link.

19. The memory system of claim 1, wherein the controller is coupled to the first and second primary memories via a point-to-two-point link.

20. The memory system of claim 1, wherein, during an access to one of the secondary memories, one of the primary memories repeats the first_signals from the controller to the one of the secondary memories being accessed, and the first signals include command/address signals.

21. The memory system of claim 1,
   wherein the second signals include data signals, a first half of the data signals being accessed is transferred to the controller by one of the secondary memories, and a second half of the data signals being accessed is transferred to the controller by another of the secondary memories.

* * * * *